(12) United States Patent
Miyamoto

(10) Patent No.: US 9,460,938 B2
(45) Date of Patent: Oct. 4, 2016

(54) SEMICONDUCTOR DEVICE INCLUDING A PLURALITY OF SEMICONDUCTOR CHIPS, AND A COVER MEMBER WITH FIRST AND SECOND BRIMS

(71) Applicant: Renesas Electronics Corporation, Kawasaki-shi (JP)

(72) Inventor: Hiroyasu Miyamoto, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/254,805

(22) Filed: Apr. 16, 2014

(65) Prior Publication Data

US 2014/0327138 A1    Nov. 6, 2014

(30) Foreign Application Priority Data

May 1, 2013  (JP) ................................. 2013-096477

(51) Int. Cl.
*H01L 23/12* (2006.01)
*H01L 21/56* (2006.01)
(Continued)

(52) U.S. Cl.
CPC ............. *H01L 21/563* (2013.01); *H01L 23/04* (2013.01); *H01L 23/10* (2013.01); *H01L 23/544* (2013.01); *H01L 24/73* (2013.01); *H01L 24/81* (2013.01); *H01L 24/83* (2013.01); *H01L 24/84* (2013.01); *H01L 25/0657* (2013.01); *H01L 25/18* (2013.01); *H01L 23/367* (2013.01); *H01L 23/49816* (2013.01); *H01L 23/49894* (2013.01); *H01L 23/50* (2013.01); *H01L 24/16* (2013.01); *H01L 24/17* (2013.01); *H01L 24/29* (2013.01); *H01L 24/32* (2013.01); *H01L 24/33* (2013.01); *H01L 24/37* (2013.01); *H01L 24/40* (2013.01); *H01L 2223/5442* (2013.01);

(Continued)

(58) Field of Classification Search
CPC ... H01L 24/14; H01L 25/0657; H01L 23/04; H01L 23/10; H01L 24/81
USPC ........ 257/737, 686, 777, 738, 778, E23.021, 257/E23.18, E25.006, E21.508, 23.048, 257/E23.069, E23.127, E25.013, E31.117; 438/15, 108, 109, 613, 64, 112
See application file for complete search history.

(56) References Cited

U.S. PATENT DOCUMENTS 5,779,081 A * 7/1998 Kimura et al. ............... 220/200
7,253,515 B2    8/2007 Horie et al.
(Continued)

FOREIGN PATENT DOCUMENTS

| JP | 7-50360 A | 2/1995 |
| JP | 8-51167 A | 2/1996 |
| JP | 2012-54597 A | 3/2012 |

*Primary Examiner* — Khiem D Nguyen
(74) *Attorney, Agent, or Firm* — McGinn IP Law Group, PLLC

(57) ABSTRACT

The long sides of a rectangular control chip and the long sides of a rectangular memory chip are arranged parallel with first sides of the upper surface of a wiring substrate in a BGA. A lid includes a pair of first brims and a pair of second brims, the widths of the second brims are formed wider than those of the first brims, and a mounting area for mounting chip parts and a junction base area for joining the lid are secured outside the short sides of the control chip mounted on the upper surface of the wiring substrate and outside the short sides of the memory chip mounted on the upper surface of the wiring substrate, which enables the wide-width second brims of the lid to be disposed on the junction base area. Hence, the mounting area of the BGA can be reduced.

21 Claims, 13 Drawing Sheets

(51) Int. Cl.
- H01L 23/544 (2006.01)
- H01L 23/10 (2006.01)
- H01L 25/065 (2006.01)
- H01L 25/18 (2006.01)
- H01L 23/04 (2006.01)
- H01L 23/498 (2006.01)
- H01L 23/00 (2006.01)
- H01L 23/367 (2006.01)
- H01L 23/50 (2006.01)
- H05K 1/02 (2006.01)

(52) U.S. Cl.
CPC ............ *H01L 2223/54486* (2013.01); *H01L 2224/16145* (2013.01); *H01L 2224/16146* (2013.01); *H01L 2224/16225* (2013.01); *H01L 2224/17181* (2013.01); *H01L 2224/26175* (2013.01); *H01L 2224/291* (2013.01); *H01L 2224/293* (2013.01); *H01L 2224/2919* (2013.01); *H01L 2224/2929* (2013.01); *H01L 2224/29324* (2013.01); *H01L 2224/29339* (2013.01); *H01L 2224/32013* (2013.01); *H01L 2224/32058* (2013.01); *H01L 2224/32059* (2013.01); *H01L 2224/32145* (2013.01); *H01L 2224/32225* (2013.01); *H01L 2224/32245* (2013.01); *H01L 2224/33181* (2013.01); *H01L 2224/3701* (2013.01); *H01L 2224/376* (2013.01); *H01L 2224/37012* (2013.01); *H01L 2224/37147* (2013.01); *H01L 2224/40225* (2013.01); *H01L 2224/40499* (2013.01); *H01L 2224/73204* (2013.01); *H01L 2224/73253* (2013.01); *H01L 2224/73255* (2013.01); *H01L 2224/73263* (2013.01); *H01L 2224/83132* (2013.01); *H01L 2224/83801* (2013.01); *H01L 2224/83851* (2013.01); *H01L 2224/84132* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2924/15311* (2013.01); *H01L 2924/16196* (2013.01); *H01L 2924/16251* (2013.01); *H01L 2924/19105* (2013.01); *H01L 2924/19106* (2013.01); *H01L 2924/351* (2013.01); *H01L 2924/3511* (2013.01); *H05K 1/0203* (2013.01); *H05K 2201/066* (2013.01); *H05K 2201/1053* (2013.01); *H05K 2201/1056* (2013.01); *H05K 2201/10515* (2013.01); *H05K 2201/10674* (2013.01)

(56) References Cited

U.S. PATENT DOCUMENTS

| | | | |
|---|---|---|---|
| 2001/0026957 A1* | 10/2001 | Atwood et al. | 438/122 |
| 2004/0135262 A1* | 7/2004 | Masuda et al. | 257/777 |
| 2006/0049423 A1* | 3/2006 | Yamaguchi et al. | 257/100 |
| 2009/0057884 A1* | 3/2009 | Too | H01L 23/04 257/723 |
| 2009/0057919 A1* | 3/2009 | Lin et al. | 257/777 |
| 2010/0270581 A1* | 10/2010 | Umakoshi | 257/100 |

* cited by examiner

… (1)

SEMICONDUCTOR DEVICE INCLUDING A PLURALITY OF SEMICONDUCTOR CHIPS, AND A COVER MEMBER WITH FIRST AND SECOND BRIMS

CROSS-REFERENCE TO RELATED APPLICATIONS

The disclosure of Japanese Patent Application No. 2013-096477 filed on May 1, 2013 including the specification, drawings and abstract is incorporated herein by reference in its entirety.

BACKGROUND

The present invention relates to semiconductor devices and, more particularly, the present invention relates to a technology that can be usefully applied to a semiconductor device having plural semiconductor chips on a wiring substrate.

Japanese Unexamined Patent Application Publication No. 2012-54597 discloses the configuration of a semiconductor device including: a package substrate on which semiconductor elements are mounted; a lid having a concave portion in which the semiconductor elements are housed and flanges formed around the outer peripheries of this concave portion; an adhesion layer formed between the semiconductor elements and the concave portion of the lid; and an adhesion layer formed between the package substrate and the flanges of the lid.

Further, Japanese Unexamined Patent Application Publication No. Hei07(1995)-50360 discloses the configuration of a semiconductor device including: a metal layer that is formed along the periphery of a surface arranged opposite to the body of a package as a ground for a solder layer and the width of which is made narrow or wide partly or here and there; and a lid substrate (lid).

Further, Japanese Unexamined Patent Application Publication No. Hei08(1996)-51167 discloses the configuration of a semiconductor device including a semiconductor package sealing lid for sealing semiconductor chips mounted on the semiconductor chip mounting section of a semiconductor package base substrate.

SUMMARY

As a package of a semiconductor device (referred to as a package or a semiconductor package hereinafter) mounted on an electronics apparatus such as a mobile terminal, a package having a configuration in which plural semiconductor chips are flip-chip mounted on a wiring substrate is well known. Particularly, the flip-chip mounting technology is an effective mounting technology for a semiconductor device used for high-speed processing in signal transmission (for example, about 12 Gbps response-frequency transmission) with outside.

Further, the flip-chip mounting technology is also an effective mounting technology for downsizing the mounting area of a package mounted on a wiring substrate.

However, in a semiconductor device including semiconductor chips that operate at such a high-speed as above, heat release for releasing heat radiated from the semiconductor chips is very important. For example, as one of means for releasing heat, the configuration of a semiconductor device, in which a cover member called a lid is joined to a semiconductor chip that is flip-chip mounted on a wiring substrate in order to release heat radiated from the semiconductor chip, is well known.

However, in reality, in the case where a semiconductor device configured to be equipped with such a lid as above is mounted on an electronics apparatus such as a mobile terminal, because the semiconductor device is mounted on a mother board in the electronics apparatus, it is necessary to make the mounting area of the package as small as possible. Further, it is necessary that the mounting height of the package should be reduced as much as possible.

In the above-mentioned three Japanese Unexamined Patent Application Publications, although the configurations of the semiconductor devices (the packages), each of which includes a lid, are disclosed, it is not fully taken into consideration to make the mounting areas of the packages as small as possible or to reduce the mounting heights of the packages as much as possible.

Other problems of the related arts and new features of the present invention will be revealed in accordance with the description of the present specification and the accompanying drawings hereinafter.

According to an aspect of the present invention, a semiconductor device includes: a first semiconductor chip a first main surface of which is rectangular; a second semiconductor chip a second main surface of which is rectangular; a wiring substrate having a first surface on which the first semiconductor chip and the second semiconductor chip are mounted via plural protruding electrodes, the first surface being formed in a quadrangular shape having a pair of first sides which are arranged opposite to each other and a pair of second sides which are arranged opposite to each other; and a cover member covering the first and second semiconductor chips. Further, in the semiconductor device, the first main surface of the first semiconductor chip and the second main surface of the second semiconductor chip are respectively arranged opposite to the first surface of the wiring substrate, and the long sides of the first semiconductor chip and the long sides of the second semiconductor chip are respectively arranged substantially parallel with the first sides of the first surface of the wiring substrate. Further, in the semiconductor device, the cover member includes a pair of first brims respectively arranged along the first sides of the first surface of the wiring substrate and a pair of second brims respectively arranged along the second sides of the first surface of the wiring substrate, and the widths of the second brims are wider than the widths of the first brims.

According to the aspect of the present invention, the mounting area of the semiconductor device may be reduced.

DETAILED DESCRIPTION

Figure 1:
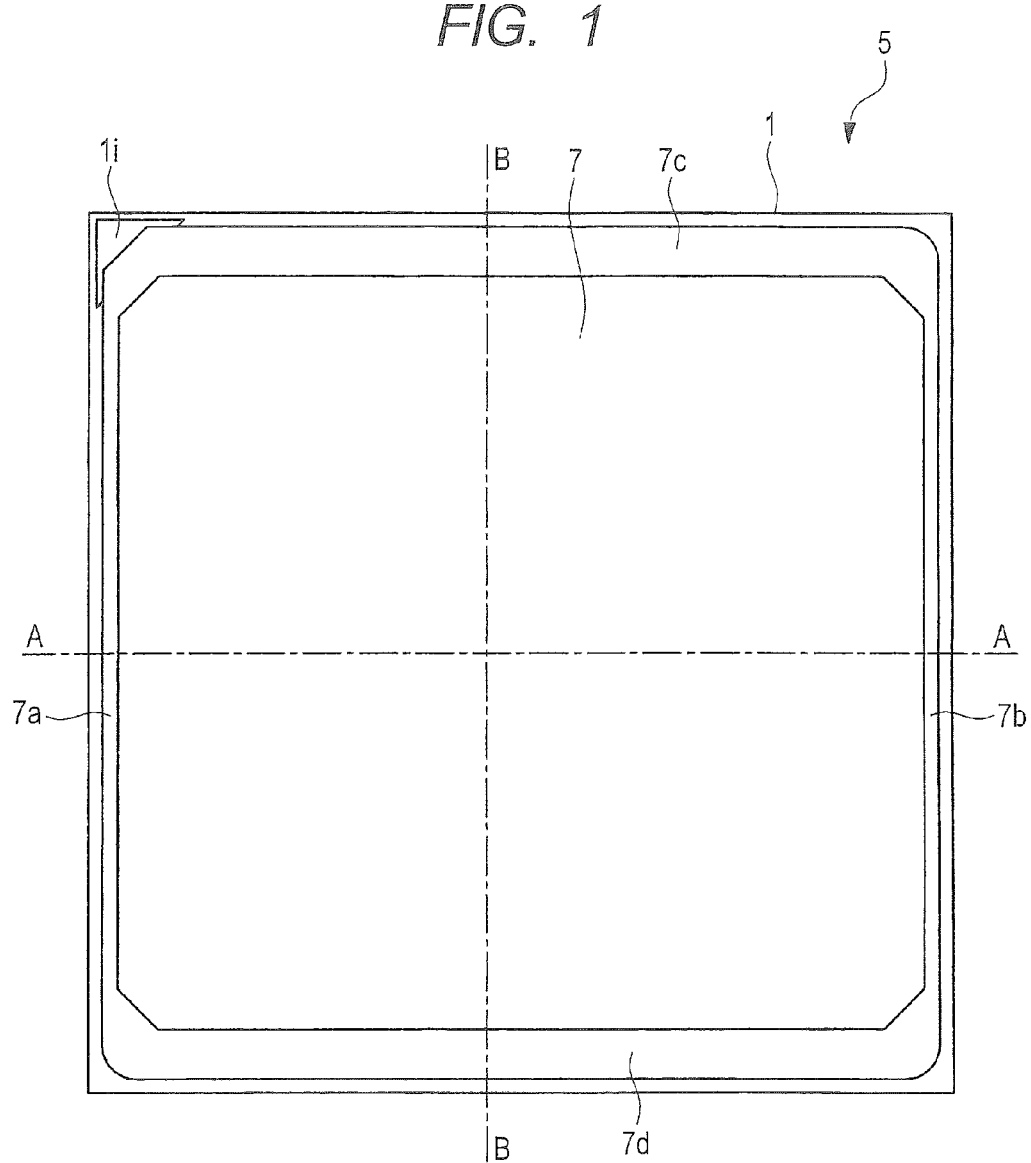
FIG. 1 is a plan view showing an example of the structure of a semiconductor device according to an embodiment of the present invention.

In the descriptions of embodiments of the present invention to be given hereinafter, explanations about the same or similar sections are not repeated as a general rule except for cases where repeated explanations are needed.

Further, in the descriptions of the embodiments, although one of the embodiment is divided into sections or into embodiments, and explanations about the sections or embodiments are respectively given for convenience of explanation, these explanations are not independent from each other, and one of these explanations has something to do with modifications, details, supplementary explanations, or the like of parts or entireties of other explanations unless otherwise explicitly specified.

Further, in the following descriptions of the embodiments, in the case where the number of elements and the like (including the number, numerical value, quality, range, and the like) are mentioned, the number of the elements and the like are not limited to specified numbers, and it will be assumed that the number of the elements and the like can be more than the specified numbers or less than the specified numbers unless otherwise explicitly specified or unless they are limited to the specified numbers in principle.

Further, in the following descriptions of the embodiments, it goes without saying that the constituent elements (including the elemental steps) of any embodiment are not necessarily indispensable unless otherwise explicitly specified or unless they are obviously indispensable in principle.

Further, in the following descriptions of the embodiments, it goes without saying that, when it is stated that one embodiment "comprises", "contains", "has", or "includes" constituent elements, it does not mean that elements other than the above constituent elements are excluded unless it is explicitly stated that the embodiment includes only the above constituent elements. In a similar way, in the following descriptions of the embodiments, it will be assumed that, when explanations are given about the shapes, positional relationships and the like of constituent elements and the like included by one embodiment, the same explanation can be said of the shapes, positional relationships and the like of approximate or similar constituent elements included by the embodiment. This is true of the above-mentioned number, range and the like.

The embodiments of the present invention will be explained in detail with reference to the accompanying drawings hereinafter. Further, throughout all the drawings used for explaining the embodiments, constituent elements having the same functions will be denoted by the same reference numerals, and redundant description thereof will be omitted. Further, there will be a case where hatching is used even in plan views in order to provide easy-to-understand drawings.

(Embodiment)

Figure 2:
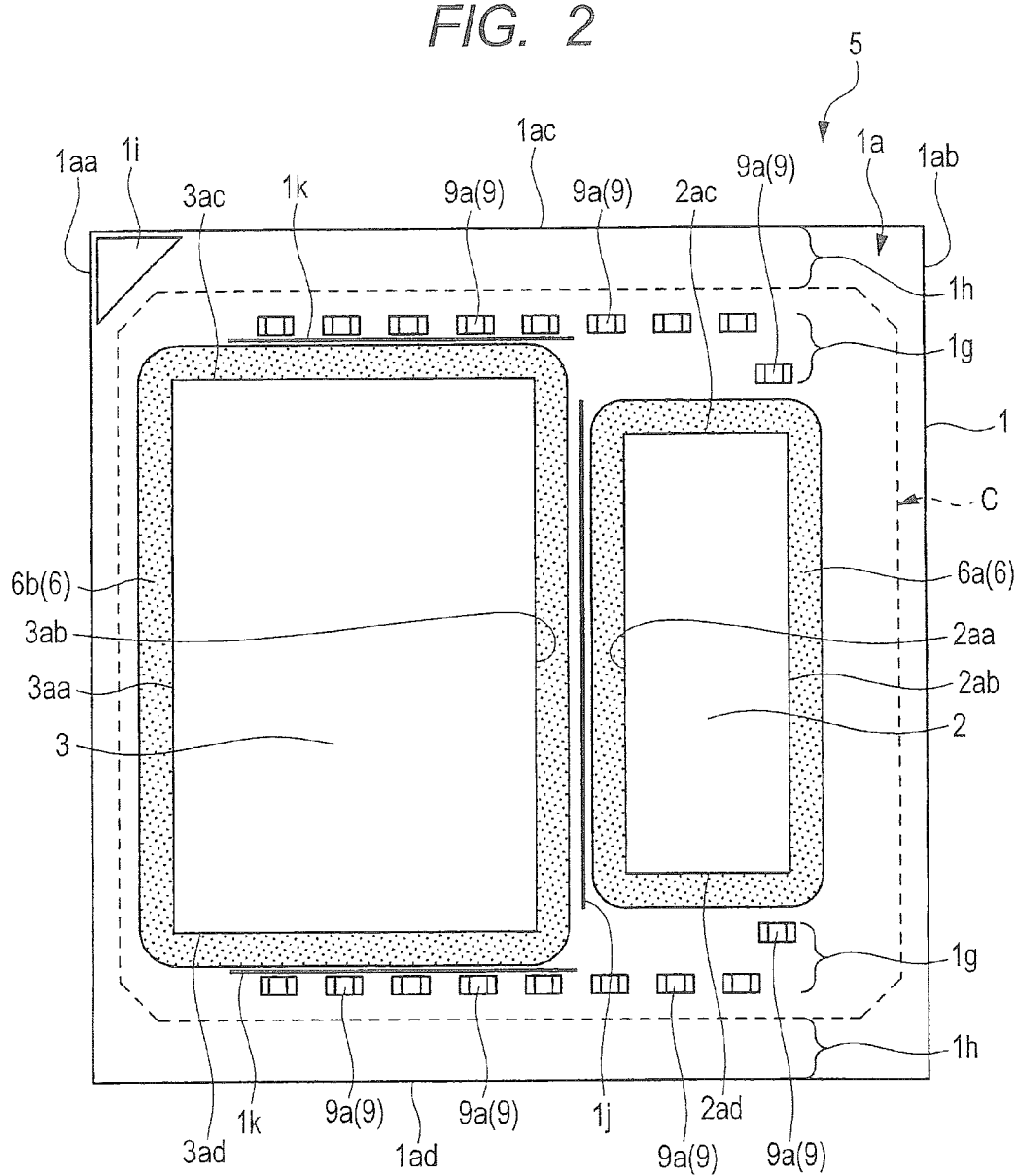
FIG. 2 is a plan view showing the structure of the semiconductor device shown in FIG. 1 with a cover member assumed to be transparent.
Figure 3:
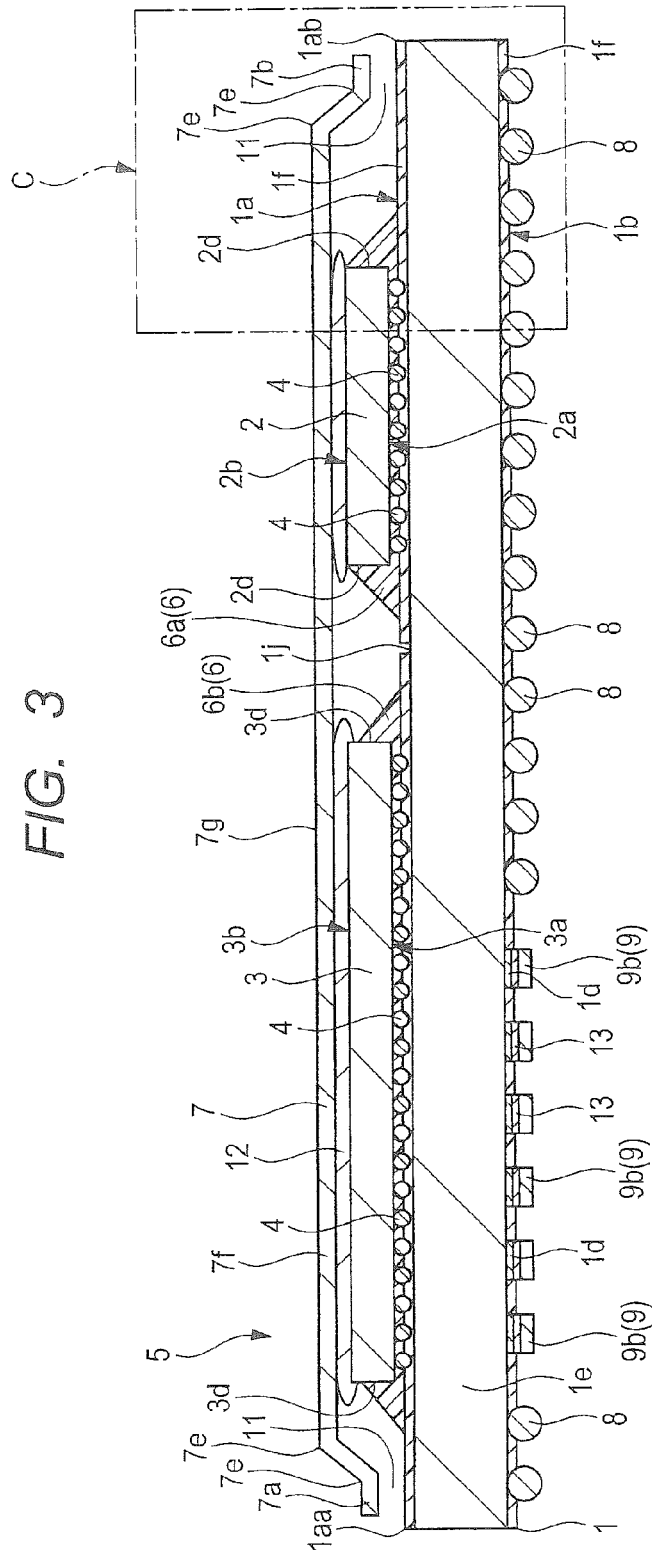
FIG. 3 is a cross-section view of the structure cut along line A-A shown in FIG. 1.
Figure 4:
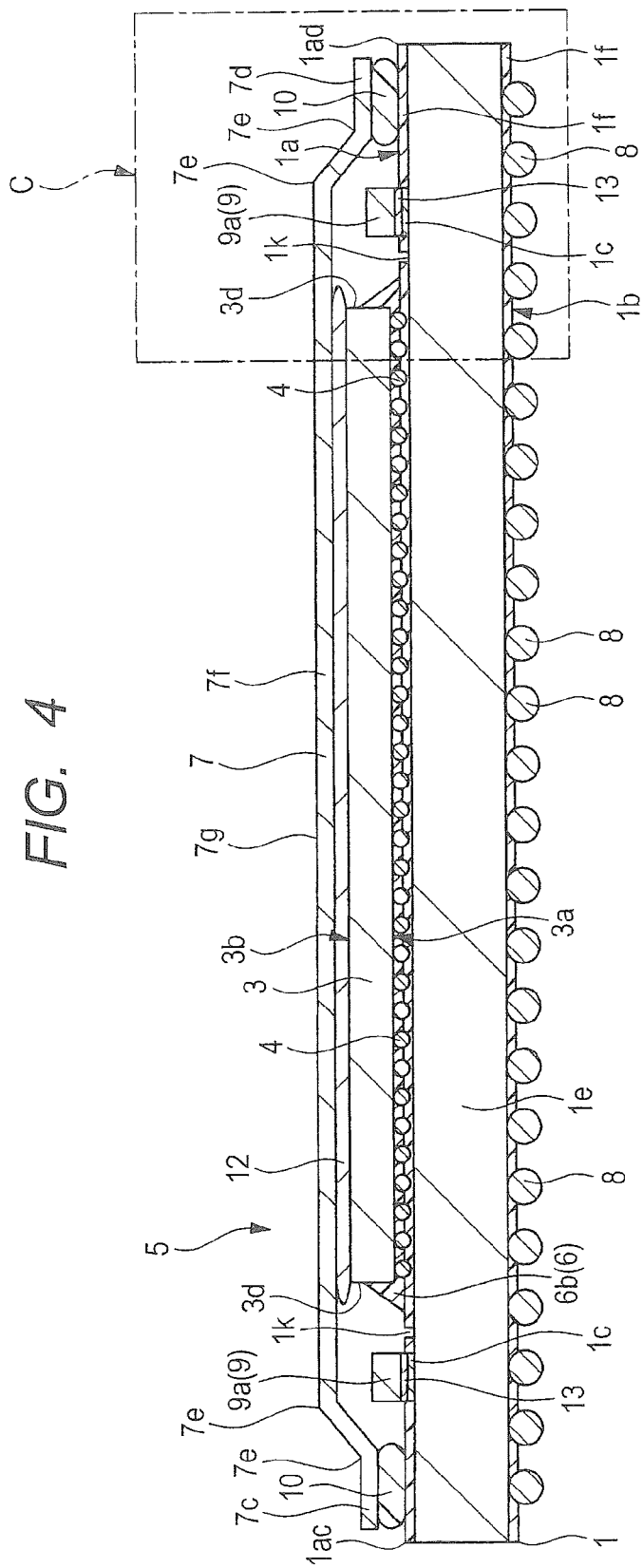
FIG. 4 is a cross-section view of the structure cut along line B-B shown in FIG. 1.
Figure 5:
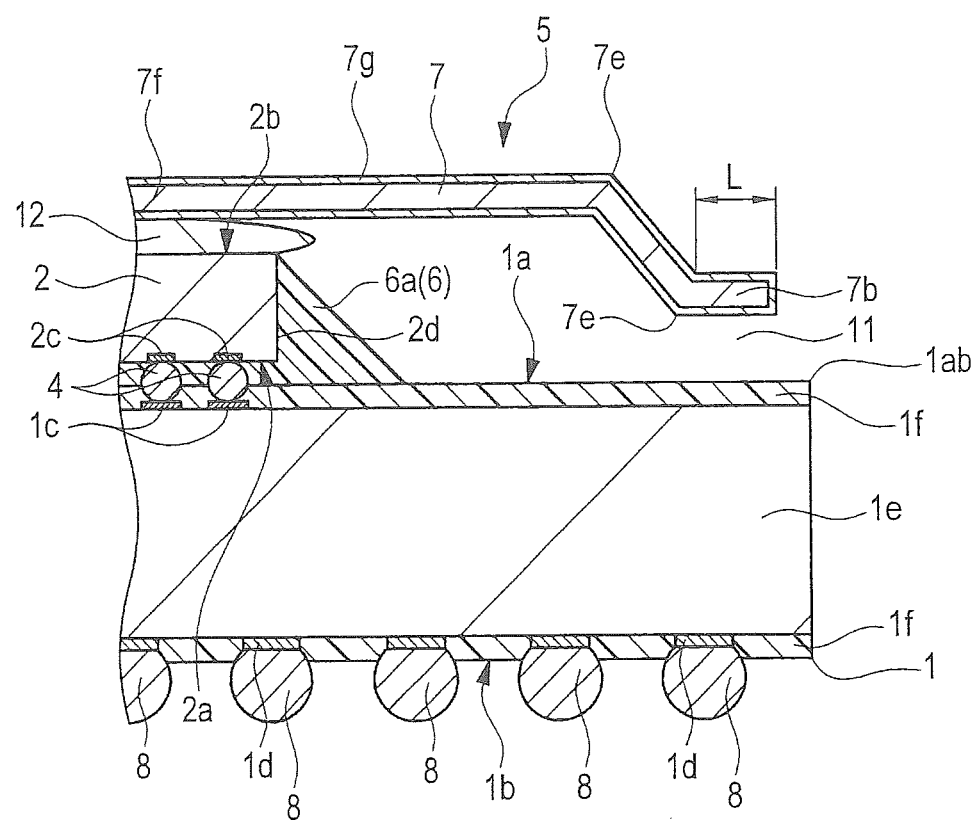
FIG. 5 is a partial enlarged cross-section view of portion C shown in FIG. 3.
Figure 6:
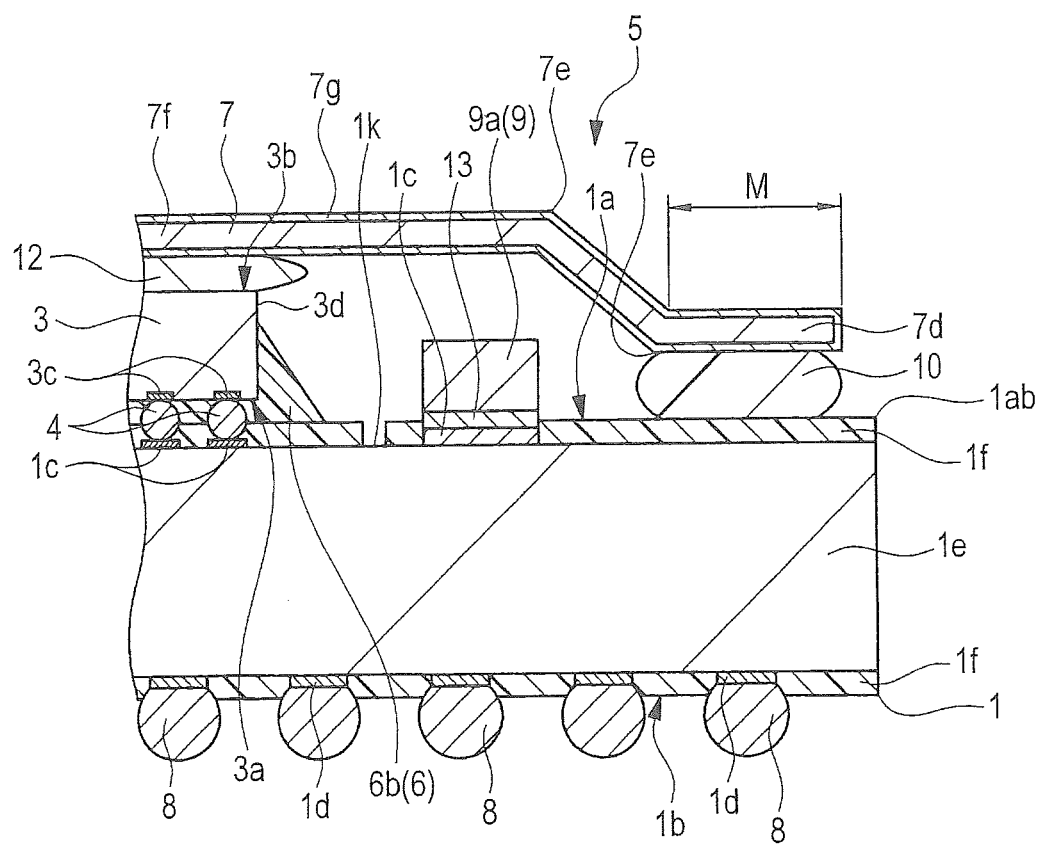
FIG. 6 is a partial enlarged cross-section view of portion C shown in FIG. 4.
Figure 7:
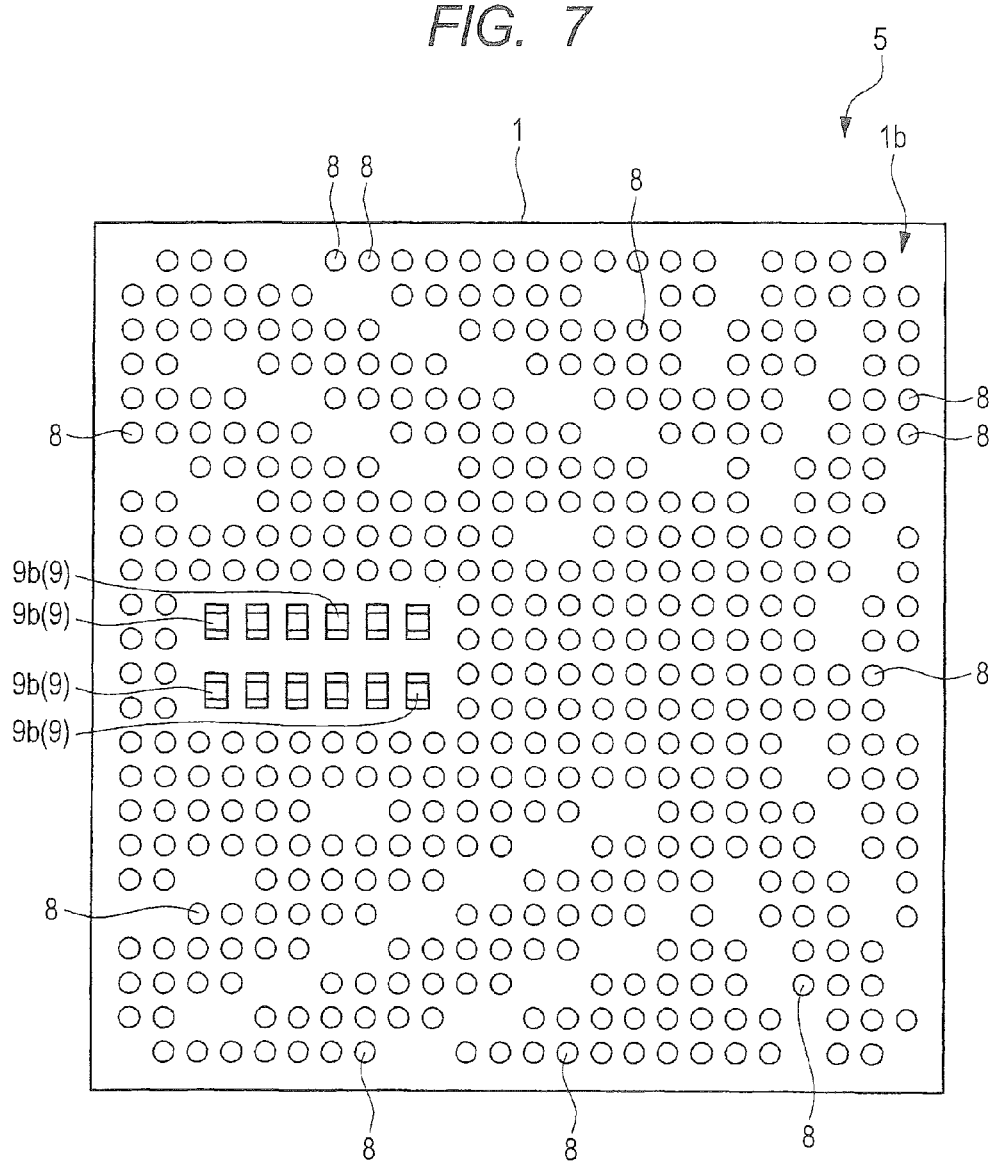
FIG. 7 is a rear surface view showing the structure of the rear surface of the semiconductor device shown in FIG. 1.
Figure 8:
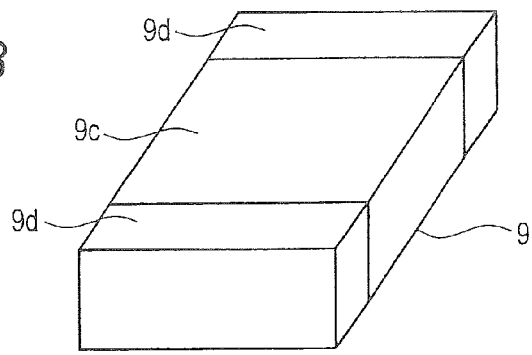
FIG. 8 is a perspective view showing an example of the structure of a chip part mounted on the semiconductor device shown in FIG. 1.
Figure 9:
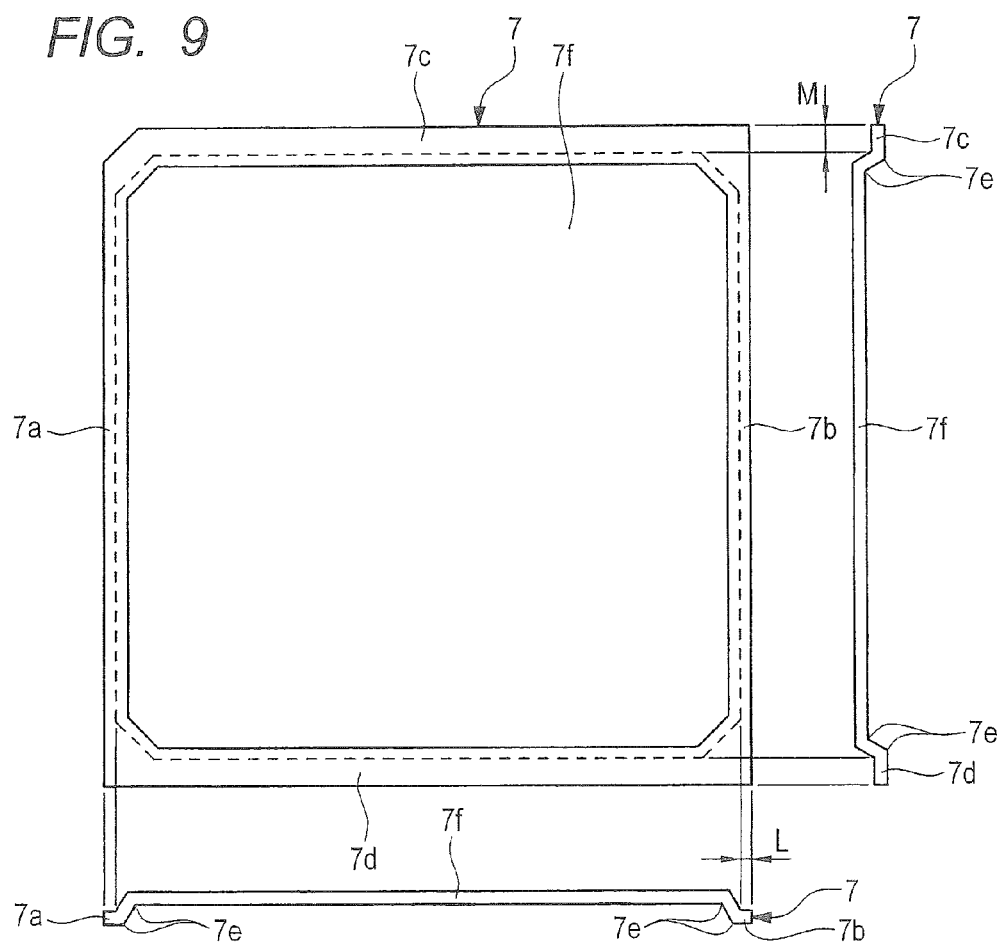
FIG. 9 is a plan view and side views showing an example of the structure of the cover member installed on the semiconductor device shown in FIG. 1.

FIG. 1 is a plan view showing an example of the structure of a semiconductor device according to an embodiment of the present invention; FIG. 2 is a plan view showing the structure of the semiconductor device shown in FIG. 1 with a cover member assumed to be transparent; FIG. 3 is a cross-section view of the structure cut along line A-A shown in FIG. 1; FIG. 4 is a cross-section view of the structure cut along line B-B shown in FIG. 1; FIG. 5 is a partial enlarged cross-section view of portion C shown in FIG. 3; and FIG. 6 is a partial enlarged cross-section view of portion C shown in FIG. 4. Further, FIG. 7 is a rear surface view showing the structure of the rear surface of the semiconductor device shown in FIG. 1; FIG. 8 is a perspective view showing an example of the structure of a chip part mounted on the semiconductor device shown in FIG. 1; and FIG. 9 is a plan view and side views showing an example of the structure of the cover member installed on the semiconductor device shown in FIG. 1.

The semiconductor device according to this embodiment is a semiconductor device housed in a semiconductor package, in which two semiconductor chips are flatly flip-chip mounted on a package substrate that is a wiring substrate, and additionally a cover member called a lid is installed so as to cover these semiconductor chips.

Further, as an example of the semiconductor device according to this embodiment, a semiconductor device, which includes external connection terminals that are plural ball electrodes mounted on the lower surface of the wiring substrate, will be explained. Therefore, the semiconductor device described in this embodiment is a semiconductor device housed in a BGA (ball grid array)-type package.

Further, the semiconductor device according to this embodiment is a semiconductor device in which high-speed processing is performed in the signal transmission between internal chips or with outside (for example, about 1.2 Gbps response-frequency transmission between internal chips and about 12 Gbps response-frequency transmission with outside are performed).

The structure of a BGA 5 used for this embodiment will be described with reference to FIG. 1 to FIG. 7. As shown in FIG. 2 to FIG. 4, the BGA 5 includes a first semiconductor chip that is flip-chip mounted on a wiring substrate 1, a second semiconductor chip that is also flip-chip mounted (flatly) beside the first semiconductor chip, and a lid (a cover member) 7 that is installed so as to cover the first and second semiconductor chips.

In this embodiment, the description will be made about an example of a semiconductor device including the first semiconductor chip that is a control chip 2, and the second semiconductor chip that is a memory chip 3. To put it concretely, the memory chip 3 is controlled by the control chip 2.

In this case, the control chip 2 has a main surface (first main surface) 2*a* and a rear surface (first rear surface) 2*b* arranged opposite to the main surface 2a, and the main surface 2a is formed in a comparatively slender rectangular. In other words, as shown in FIG. 2, the control chip 2 is a semiconductor chip whose planar view is a slender rectangular.

On the other hand, the memory chip 3 has a main surface (second main surface) 3a and a rear surface (second rear surface) 3b arranged opposite to the main surface 3a, and the main surface 3a is formed in a comparatively near-quadrate rectangular with a large area. In other words, as shown in FIG. 2, the memory chip 3 is a rectangular whose planar view is near-quadrate, and whose main surface 3a has a large area compared with the main surface 2a of the control chip 2. This is because it is preferable that the memory chip 3 has a large memory capacity, so that the area of the main surface 3a is set larger (the chip size of the memory chip 3 is much larger than that of the control chip 2).

Further, as shown in FIG. 5, plural electrode pads (electrodes) 2c are formed on the main surface 2a of the control chip 2, while as shown in FIG. 6, plural electrode pads (electrodes) 3c are also formed on the main surface 3a of the memory chip 3. Further, semiconductor integrated circuits are respectively formed inside the control chips 2 and memory chip 3, and these circuits are electrically coupled with the electrode pads 2c and the electrode pads 3C.

As shown in FIG. 3, the wiring substrate 1 has an upper surface (a first surface) 1a and a lower surface (a second surface) 1b opposite to the upper surface, and the upper surface 1a and the lower surface 1b are arranged with a base material 1e therebetween. Further, as shown in FIG. 2, the upper surface 1a is formed in a quadrangular shape having a pair of first sides 1aa and 1ab which are arranged opposite to each other and a pair of second sides 1ac and 1ad which are arranged opposite to each other. On the other hand, as shown in FIG. 7, the lower surface 1b is also formed in a quadrangular shape as is the case with the upper surface 1a.

Further, as shown in FIG. 5 and FIG. 6, plural rounds (terminals or electrodes) 1c are mounted on the upper surface 1a of the wiring substrate 1, while plural rounds (terminals or electrodes) 1d are also mounted on the lower surface 1b. Further, solder resist films (insulating films) 1f are formed on the upper surface 1a and on the lower surface 1b, and the rounds 1c on the upper surface 1a are exposed at the plural openings of the solder resist film 1f on the upper surface 1a and the rounds 1d on the lower surface 1b are exposed at the plural openings of the solder resist films 1f on the lower surface 1b.

Therefore, in the wiring substrate 1, the rounds 1c on the upper surface 1a and the rounds 1d on the lower surface 1b corresponding to the rounds 1c are electrically coupled via internal wirings or via wirings (not shown) respectively.

The control chip 2 and memory chip 3 are flip-chip mounted on the upper surface 1a of the wiring substrate 1 that is configured as above. In other words, the main surface 2a of the control chip 2 and the main surface 3a of the memory chip 3 are respectively arranged opposite to the upper surface 1a of the wiring substrate 1. Further, the main surface 2a of the control chip 2 and the main surface 3a of the memory chip 3 are respectively electrically coupled to the rounds 1c on the upper surface 1a of the wiring substrate 1 via plural bump electrodes (bumps or protruding electrodes) 4.

Further, as shown in FIG. 3, FIG. 4, and FIG. 7, ball electrodes (external electrode terminals) 8, which are external connection terminals, are mounted in a grid pattern (a lattice-like pattern) on the lower surface 1b of the wiring substrate 1.

In the BGA 5 according to this embodiment described above, the electrode pads 2c of the control chip 2 and electrode pads 3c of the memory chip 3 mounted on the upper surface 1a of the wiring substrate 1 are respectively coupled to the plural ball electrodes 8 via the corresponding bump electrodes 4, rounds 1c, and rounds 1d.

Further, in the BGA 5, as shown in FIG. 3 to FIG. 6, a space between the control chip 2 and the wiring substrate 1 and a space between the memory chip 3 and the wiring substrate are respectively filled with underfills (resin agents, or adhesive agents) 6. Filling the above spaces with the underfills makes it possible to reduce thermal stresses applied to flip-chip junctions when heat is given to a package (a semiconductor device) in a heat treatment (for example, in a heat cycle test) performed after the package is assembled because the underfills 6 can alleviate the difference between the thermal expansion coefficient of each chip and that of the wiring substrate 1.

In other words, the flip-chip junctions of the control chip 2 and the memory chip 3 can be strengthened by the underfills 6.

Further, the underfills 6 are formed so as to cover the side surfaces 2d of the control chip 2 and the side surfaces 3d of the memory chip 3, so that the control chip 2 and the memory chip 3 themselves can be also protected by the underfills 6.

Further, in the planar view of the BGA 5 according to this embodiment, the upper surface 1a of the wiring substrate 1 is quadrate as shown in FIG. 2. In other words, the lengths of four sides, that is, the first sides 1aa and 1ab arranged opposite to each other and the second sides 1ac and 1ad opposite to each other of the upper surface 1a are equal to each other.

While the upper surface 1a of the wiring substrate 1 is quadrate, the long sides 2aa and 2ab of the main surface 2a of the control chip 2 which are opposite to each other, and the long sides 3aa and 3ab of the main surface 3a of the memory chip 3 which are opposite to each other are respectively arranged substantially parallel with the first side 1aa (or the first side 1ab) of the upper surface 1a of the wiring substrate 1.

In other words, the short sides 1ac and 2ad of the main surface 2a of the control chip 2 which are opposite to each other, and the short sides 3ac and 3ad of the main surface 3a of the memory chip 3 which are opposite to each other, are respectively arranged substantially parallel with the second side 1ac (or the second side 1ad) of the upper surface 1a of the wiring substrate 1.

Further, in the BGA 5 according to this embodiment, plural chip parts (chip capacitors in this embodiment) 9 (9a) are mounted outside the short sides 2ac and 2ad of the control chip 2 on the upper surface 1a of the wiring substrate 1 and outside the short sides 3ac and 3ad of the memory chip 3 on the upper surface 1a of the wiring substrate 1.

To put it in detail, on the upper surface 1a of the wiring substrate 1, the chip parts 9a (9) are mounted on the area between the short side 2ac (short side 2ad) of the control chip 2 and the second side 1ac (the second side 1ad) of the upper surface 1a of the wiring substrate 1. Further, the chip parts 9a (9) are similarly mounted on the area between the short side 1ac (short side 3ad) of the memory chip 3 and the second side 1ac (the second side 1ad) of the upper surface 1a of the wiring substrate 1.

Further, as shown in FIG. 3 and FIG. 7, plural chip parts 9b (9) are mounted on the lower surface 1b of the wiring substrate 1.

These chip parts 9a, 9b (9) are mounted for noise reduction in the BGA 5. Because high-speed processing (for example, 1.2 Gbps response-frequency transmission or higher transmission) is performed in the signal transmission between internal chips or with outside in the BGA 5, signals are apt to be influenced by noises. Particularly, there is a high possibility that analog circuits are influenced by noises oscillated from digital circuits. Therefore, a noise removal effect can be enhanced by mounting many chip parts 9, which are chip capacitors, in the vicinity of the semiconductor chips.

In the BGA 5 according to this embodiment, because the number of chip parts 9 mounted on the upper surface 1a of the wiring substrate 1 is not sufficient, several number of chip parts 9 are also mounted on the lower surface 1b of the wiring substrate 1.

Here, as shown in FIG. 8, a chip part 9 has a structure in which terminal sections (electrode sections) 9d are formed on both sides of the body 9c of the chip part 9, and the chip part 9 is coupled to the wiring substrate 1 via solder 13 as shown in FIG. 4 and FIG. 6. Further, in order to make the number of mounted chip parts 9 as small as possible, it is recommendable that the chip parts 9 should be mounted as near to the semiconductor chips as possible or the chip parts (chip capacitors) 9 of large capacity (large size) should be mounted.

However, because there is restriction on the size (height or the like) of the package imposed by user's specifications or the like, it is difficult to mount large sized chip parts (chip capacitors) 9, therefore it is also necessary to mount a large number of low-height chip parts 9 in the case where the BGA 5 is used in order to reduce noises.

Therefore, in the BGA 5 according to this embodiment, both rectangular control chip 2 and memory chip 3 are disposed so that the long side 2aa (or 2ab) of the control chip 2 and the long side 3aa (or 3ab) of the memory chip 3 are substantially parallel with and as near as possible to the first side 1aa (or 1ab) of the upper surface 1a of the quadrate wiring substrate 1. (FIG. 2 shows an example in which the long side 2aa of the control chip 2 and the long side 3aa of the memory chip 3 are substantially parallel with and as near as possible to the first side 1aa of the upper surface 1a of the quadrate wiring substrate 1.) In addition to the above disposing condition, the control chip 2 and memory chip 3 are disposed at the middle position between the second sides 1ac and 1ad of the upper surface 1a of the quadrate wiring substrate 1. In this case, spaces on which plural chip parts 9 are mounted can be secured on the sides of the second sides 1ac and 1ad of the upper surface 1a of the quadrate wiring substrate 1.

Further, joint base areas 1h to which the lid (cover member) 7 is joined are prepared on the ends in the other direction (the direction parallel with the first sides 1aa and 1ab) outside the mounting areas 1g of the plural chip parts 9. In other words, because the mounting space for mounting the control chip 2 and memory chip 3 must be secured on the ends in the one direction (the direction parallel with the second sides 1ac and 1ad) of the wiring substrate 1, the joint base areas 1h to which the lid 7 is joined are not provided on the ends on the sides of the first sides 1aa and 1ab.

In other words, in the case of mounting two rectangular semiconductor chips and plural chip parts 9 in the vicinity of the two chips on the wiring substrate 1 whose upper surface is quadrate, as shown in FIG. 2, an arrangement, in which the long sides of both semiconductor chips are set in the same direction, and the mounting areas 1g for mounting the chip parts 9 and the joint base areas 1h to which the lid 7 is joined are secured in areas outside the short sides of the semiconductor chips, enables the mounting area of the semiconductor device the smallest.

As a result, the above-described arrangement of the chips, chip parts 9, and the joint base areas 1h to which the lid 7 is joined can makes the size of the planar view of the BGA 5 smallest.

Therefore, the lid 7 is joined to the wiring substrate 1 on the sides of the second sides 1ac and 1ad of the upper surface 1a of the wiring substrate 1 via adhesive agents 10 because the joint base areas 1h shown in FIG. 2 are provided on the edges of the upper surface 1a on the sides of the second sides 1ac and 1ad as shown in FIG. 4, while the lid 7 is not coupled to the wiring substrate 1 on the sides of the first sides 1aa and 1ab of the upper surface 1a of the wiring substrate 1 because the joint base areas 1h are not provided an the sides of the first sides 1aa and 1ab as shown in FIG. 3.

Here, an area C shown in FIG. 2 is an area covered by the lid 7.

As shown in FIG. 1, FIG. 3, and FIG. 4, the lid 7 includes a pair of brims (first brims or flanges) 7a and 7b respectively arranged along the first sides 1aa and 1ab of the upper surface 1a of the wiring substrate 1 and a pair of brims (second brims or flanges) 7c and 7d respectively arranged along the second sides 1ac and 1ad.

In other words, flange-shaped brims 7a, 7b, 7c, and 7d are formed on the periphery of the lid 7, and an area inside the periphery is a ceiling portion 7f that is formed in a position higher than the brims 7a, 7b, 7c, and 7d and that is supported by bending portions 7e formed by a bending process. In this case, the bending amounts of the bending portions 7e are, for example, 0.2 mm.

Therefore, the lid 7 has the ceiling portion 7f that is formed in a high position, and the flange-shaped brims 7a, 7b, 7c, and 7d that are formed around the ceiling portion 7f.

Further, as shown in FIG. 5, FIG. 6, and FIG. 9, the widths M of the brims 7c and 7d are set larger than the widths L of the brims 7a and 7b (M>L, for example, M=1.5 mm, and L=0.5 mm). This is because the joint base areas 1h are provided on the ends on the sides of the second sides 1ac and 1ad of the quadrate upper surface 1a of the wiring substrate 1 and the joint base areas 1h are not provided on the ends on the sides of the first sides 1aa and 1ab. On this account, the widths M of the brims 7c and 7d of the lid 7 corresponding to the edges where the joint base areas 1h are provided are larger than the widths L of the brims 7a and 7b corresponding to the edges where the joint base areas 1h are not provided.

Therefore, in the BGA 5, as shown in FIG. 4 and FIG. 6, the brims 7c and 7d of the lid 7 are joined to the wiring substrate 1 via the adhesive agents 10 in the joint base areas 1h on the ends on the sides of the second sides 1ac and 1ad of the upper surface 1a of the wiring substrate 1, while, as shown in FIG. 3 and FIG. 5, the brims 7a and 7b of the lid 7 are not coupled to the wiring substrate 1 on the edges on the sides of the first sides 1aa and 1ab of the upper surface 1a of the wiring substrate 1, and there are spaces 11 between the brims 7a and 7b of the lid 7 and the wiring substrate 1.

Here, the adhesive agents 10 that join the lid 7 and the wiring substrate 1 are, for example, epoxy resin adhesive agents 10.

Further, in the BGA 5, as shown in FIG. 2, two rectangular semiconductor chips are mounted on the wiring substrate 1, and the two chips are flip-chip mounted so that the short sides 2ac and 2ad of the control chip 2 and the short sides 3*ac* and 3*ad* of the memory chip 3 are arranged parallel with the second sides 1*ac* and 1*ad* of the upper surface 1*a* of the wiring substrate 1.

When thermal stresses are applied to flip-chip junctions in a heat treatment performed after the package is assembled (for example, in a heat cycle test), there is a tendency for warpage to occur in the direction of the second sides 1*ac* and 1*ad* of the upper surface 1*a* of the wiring substrate 1 (in the extending direction of the short sides 2*ac* and 2*ad* of the control chip 2 and the short sides 3*ac* and 3*ad* of the memory chip 3) owing to the thermal contraction of the underfills 6 used for the semiconductor chips.

Therefore, in the BGA 5 according to this embodiment, the widths of the brims (the second brims) 7*c* and 7*d* of the lid 7 is set larger than the widths of the brims (the first brims) 7*a* and 7*b*, and the lid 7 is joined to the wiring substrate 1 at the brims 7*c* and 7*d* via the adhesive agents 10, which enhances the strength of the wiring substrate 1 in the extending direction of the second sides 1*ac* and 1*ad* of the upper surface 1*a* of the wiring substrate 1 (in the extending direction of the short sides 2*ac* and 2*ad* of the control chip 2 and the short sides 3*ac* and 3*ad* of the memory chip 3).

As a result, in the BGA 5, even when the underfills 6 used for the semiconductor chips contract owing to thermal stress, the warpage of the wiring substrate 1 can be suppressed.

Here, the lid 7 is comprised of, for example, a metal plate such as a cupper plate. Metal plating 7*g* is performed on the surface of the lid 7 as shown in FIG. 3 and FIG. 4. Further, the lid 7 is joined to the rear surface (the surface facing upward) 2*b* of the control chip 2 and the rear surface (the surface facing upward) 3*b* of the memory chip 3 via thermal conductive adhesive agents (electrically conductive resin agents) 12 (or via solder agents).

The above-mentioned thermal conductive adhesive agents 12 are, for example, made of silver paste or aluminum-based paste.

As described above, because the control chip 2 and the memory chip 3 are joined to the lid 7 comprised of the metal plate via the thermal conductive adhesive agents 12, heat radiated from the control chip 2 and the memory chip 3 can be released through the lid 7 via the thermal conductive adhesive agents 12, therefore the reliability of the BGA 5 can be improved.

Further, as shown in FIG. 1 and FIG. 2, a marking 1*i* is put to one of four corners of the upper surface 1*a* of the wiring substrate 1.

This marking 1*i* plays a role of a marker used for aligning the semiconductor chips and the lid 7 when the semiconductor chips and the lid 7 are mounted on the wiring substrate 1. By mounting the semiconductor chips and the lid 7 on the wiring substrate 1 with reference to the marking 1*i*, the mounting directions of the wiring substrate 1, the control chip 2, the memory chip 3, and the lid 7 can be checked without fail. Also after the configuration of the BGA 5 is completed, the directions of the semiconductor device can be shown by the marking 1*i*.

Further, in the BGA 5 according to this embodiment, as shown in FIG. 2 and FIG. 3, a resin diffusion prevention section is formed between the control chip 2 and the memory chip 3 on the upper surface 1*a* of the wiring substrate 1. In this embodiment, the resin diffusion prevention section is a groove (a concave portion) 1*j* that is formed by grooving the solder resist film 1*f* formed on the upper surface 1*a* of the wiring substrate 1. Alternatively, the groove (the concave portion) 1*j* can be formed by partially removing the solder resist film 1*f* so that a part of the wiring layer (copper) under the solder resist film 1*f* is exposed.

In the assembly of the BGA 5, in the case where, after the control chip 2 and the memory chip 3, the sizes of which are different from each other, are mounted on the wiring substrate 1, the underfills 6 are respectively dropped between the control chip 2 and the wiring substrate 1 and between the memory chip 3 and the wiring substrate 1, if the underfills 6 used for the semiconductors make contact with each other, an phenomenon that one of the underfills is absorbed by the other owing to the imbalance between the surface tensions of the underfills may occur.

This phenomenon is a phenomenon that often occurs because, if the applying quantity per applied area of an underfill is larger, the underfill is wettingly diffuses more easily. Therefore a underfill 6 whose property is easily influenced by the variation of applying quantity (that is, the applied area of the underfill is small) has a tendency to wettingly diffuse easily, and a underfill 6 that has a comparatively stable applying quantity per applied area (that is, the applied area of the underfill is large) absorbs the underfill 6 that has the small applied area. In the BGA 5, the underfill 6*a* that is applied to the small applied area of the control chip 2 is absorbed by the underfill 6*b* that is applied to the large applied area of the memory chip 3, so that a phenomena that the balance between the applying quantities is lost occurs.

Therefore, by forming the groove 1*j* on an area between the control chip 2 and the memory chip 3 on the upper surface 1*a* of the wiring substrate 1, and more precisely, on the area between the applied areas of the underfill 6*a* and the underfill 6*b*, the wetting diffusion of the underfill 6*a* that is apt to diffuse is blocked, so that the underfill 6*a* can be prevented from diffusing into the underfill 6*b* side (the memory chip 3 side).

Further, in the BGA 5, as shown in FIG. 2 and FIG. 4, grooves (concave portions) 1*k*, which are resin diffusion prevention sections, are formed on areas between at least one semiconductor chip of the control chip 2 and the memory chip 3 and the plural chip parts 9 on the upper surface 1*a* of the wiring substrate 1. In this embodiment, because the long sides 3*aa* and 3*ab* of the memory chip 3 are longer than the long sides 2*aa* and 2*ab* of the control chip 2, the underfill 6*b* is nearer to the chip parts 9 than the underfill 6*a*.

Therefore the grooves 1*k* are formed on the areas between the memory chip 3 and the chip parts 9 on the upper surface 1*a* of the wiring substrate 1.

Therefore, when the underfill 6*b* is dropped to fill the gap between the memory chip 3 and the upper surface 1*a* of the wiring substrate 1, the wetting diffusion of the underfill 6*b* that is apt to diffuse into the areas of the chip parts 9 is blocked, so that the underfill 6*b* can be prevented from diffusing into the mounting areas 1*g* of the chip parts 9.

A defect that occurs when the underfill (resin) 6*b* adheres to a solder joint of a chip part 9 will be described below.

Figure 14:
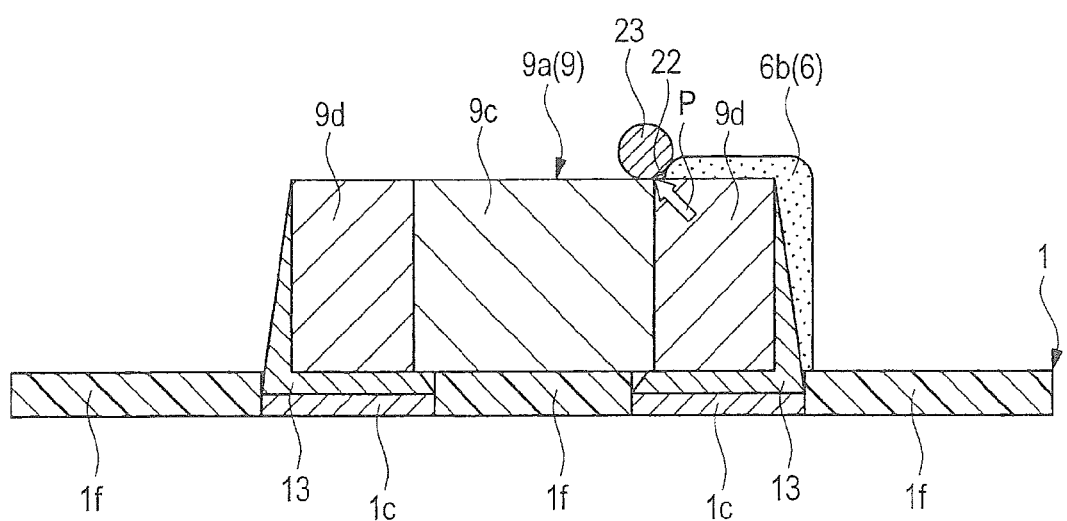
FIG. 14 is a cross-section view showing a state in which solder is pushed out owing to the adherence of an underfill to a chip part.

FIG. 14 is a cross-section view showing a state in which solder is pushed out owing to the adherence of an underfill to a chip part. If the underfill (resin) 6*b* adheres to the solder joint of the chip part 9, solder 23 is pushed out (in the P direction in FIG. 14) from the opening 22 of the adherence portion of the underfill 6*b* by repeated bendings owing to temperature change and the like, and the pushed-out solder 23 may form a lump of solder on the terminal section 9*d* of the chip part 9.

As a result, such defect may occur that the pushed-out solder 23 gets into touch with surrounding parts and shorts out or the pushed-out solder 23 falls and gets into touch with other parts and shorts out.

Therefore, by forming the grooves 1k on the areas between the memory chip 3 and the chip parts 9, the wetting diffusion of the underfill 6b is blocked and the underfill 6b is prevented from adhering to the chip parts 9, so that the above-mentioned defect can be prevented from occurring.

Further, as shown in FIG. 3 and FIG. 7, the plural ball electrodes (external connection terminals) 8 and the plural chip parts (chip capacitors) 9b are formed on the lower surface 1b of the wiring substrate 1 in the BGA 5. Further, as shown in FIG. 3, the heights of the ball electrodes 8 from the lower surface 1b are set higher than the heights of the plural chip parts 9b, which are mounted on the lower surface 1b, from the lower surface 1b.

Thanks to the above-mentioned configuration, when the BGA 5 is mounted on a mounting board or the like, mounting defects regarding the BGA 5 such as the chip parts 9b mounted on the lower surface 1b of the wiring substrate 1 getting into touch with the mounting board can be prevented from occurring.

In the BGA 5 according to this embodiment, the long sides 2aa, 2ab, 3aa, and 3ab of the two semiconductor chips are arranged parallel with the first sides 1aa and 1ab of the upper surface 1a of the wiring substrate 1, and the lid 7 has a pair of brims 7a and 7b respectively arranged along parallel with the first sides 1aa and 1ab, and a pair of brims 7c and 7d respectively arranged along the second sides 1ac and 1ad. Further, the widths of the brims 7c and 7d are set larger than the widths of the brims 7a and 7b.

Thanks to the above-mentioned configuration, two areas are secured respectively on the side of the short side 2ac of the control chip 2 and the short side 3ac of the memory chip 3 and on the side of the short side 2ad of the control chip 2 and the short side 3ad of the memory chip 3 on the upper surface 1a of the wiring substrate 1, so that the wide brims 7c and 7d of the lid 7 can be disposed respectively on the above two areas.

In other words, in the BGA 5, the long sides of the two rectangular semiconductor chips are arranged in the same direction and the short sides of the two rectangular semiconductor chips are arranged in the same direction, and the semiconductor chips are mounted to a maximum extent in one of two directions of the upper surface 1a of the quadrate wiring substrate 1 (in the direction parallel with the second sides 1ac and 1ad). Further, the mounting areas 1g for the chip parts 9 and the joint base areas 1h for the lid 7 are secured on the edges along the second sides 1ac and 1ad (on both ends in the direction parallel with the first sides 1aa and 1ab).

As a result, the wide brims 7c and 7d of the lid 7 can be disposed on the joint base areas 1h on the upper surface 1a of the wiring substrate 1, and the lid 7 can be joined to the wiring substrate 1 through the joint base areas 1h via the adhesive agents 10.

Thanks to the above-mentioned configuration, it becomes possible to reduce the area of the planar view of the BGA 5 that includes the two rectangular semiconductor chips, that is, the control chip 2 and memory chip 3, and the lid 7 which covers these semiconductor chips.

In other words, the mounting area of the BGA 5, which includes the wiring substrate 1 on which the two rectangular semiconductor chips and the plural chip parts 9 are mounted (the two semiconductor chips are flatly mounted) and the lid 7, can be minimized with the use of the above configuration.

Next, modifications of this embodiment will be explained below.

Figure 10:
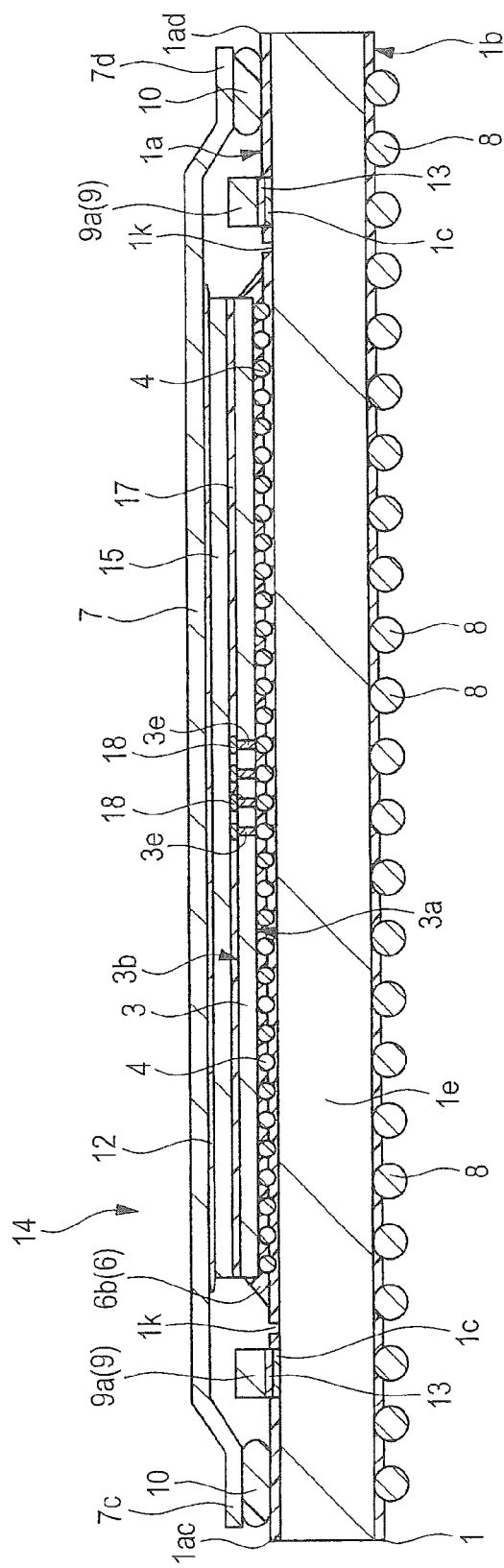
FIG. 10 is a cross-section view showing the structure of a semiconductor device according to a first modification of the embodiment.
Figure 11:
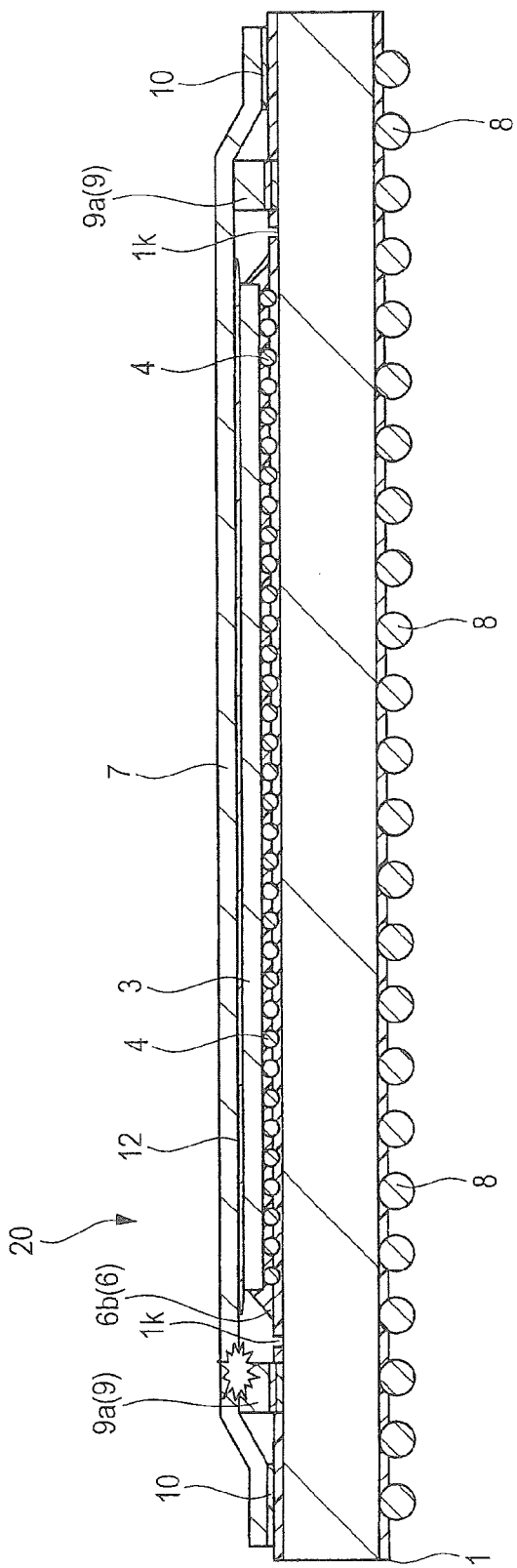
FIG. 11 is a cross-section view showing the structure of a semiconductor device according to a first comparative example.
Figure 12:
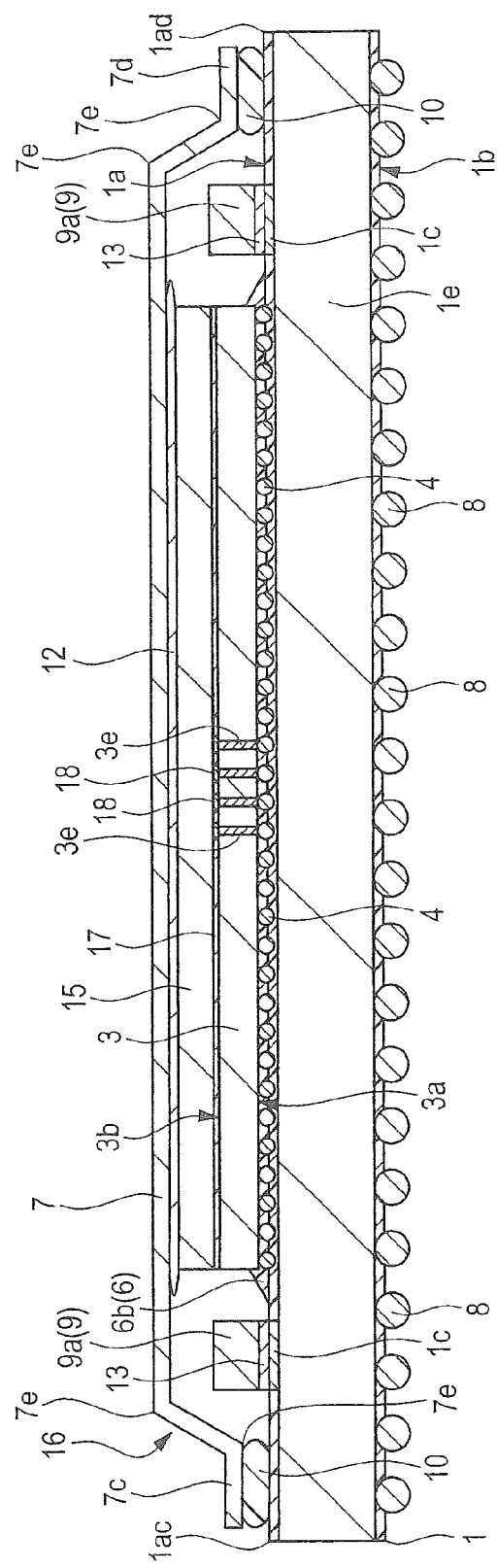
FIG. 12 is a cross-section view showing the structure of a semiconductor device according to a second modification of the embodiment.
Figure 13:
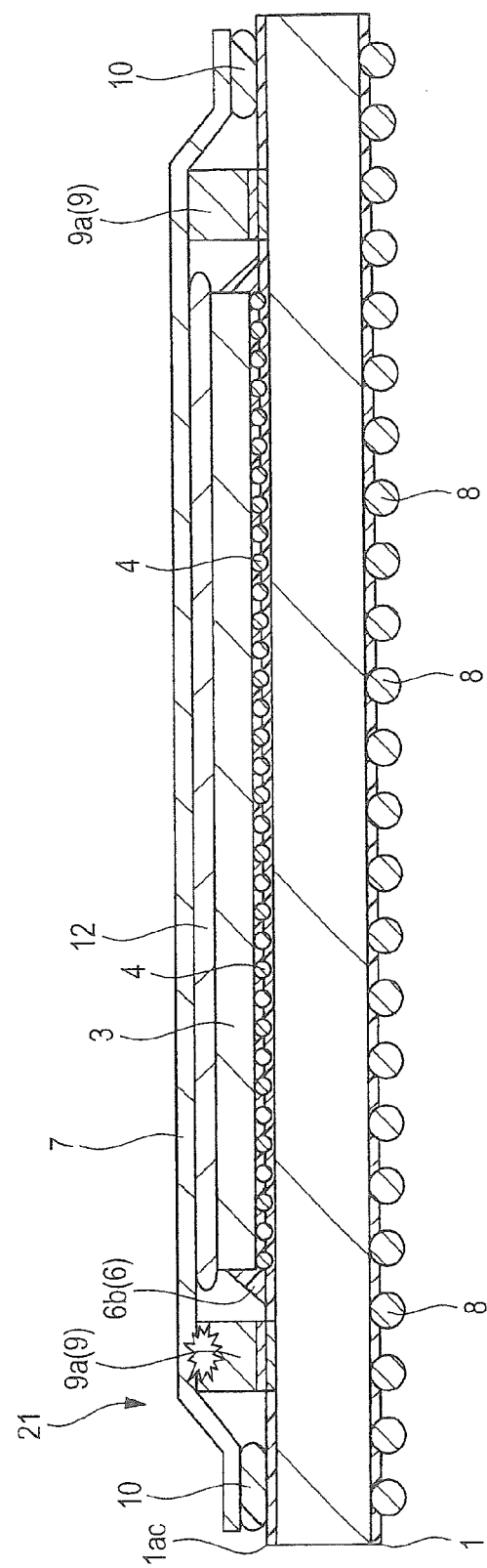
FIG. 13 is a cross-section view showing the structure of a semiconductor device according to a second comparative example.

FIG. 10 is a cross-section view showing the structure of a semiconductor device according to a first modification of the embodiment. FIG. 11 is a cross-section view showing the structure of a semiconductor device according to a first comparative example. FIG. 12 is a cross-section view showing the structure of a semiconductor device according to a second modification of the embodiment. FIG. 13 is a cross-section view showing the structure of a semiconductor device according to a second comparative example.

The first modification shown in FIG. 10 has a structure including a thin structured memory chip 3 (It is also all right if the first modification includes a thin structured control chip 2 instead of the thin structured memory chip 3).

It is well known that reducing the thickness of a semiconductor chip in which a digital circuit is embedded is effective as a means to reduce noises generated from this semiconductor chip. To put it concretely, the cross-section area of the semiconductor is made small by reducing the thickness of the semiconductor chip, so that the resistance value of the semiconductor chip becomes large and the transfer of the noises generated from the semiconductor chip is hampered.

Here, a BGA 20 of the first comparative example shown in FIG. 11 has a structure equipped with a thin structured memory chip 3 (It is also all right if the first comparative example has a structure equipped with a thin structured control chip 2 instead of the thin structured memory chip 3). In this case, because the memory chip 3 is a thin structured chip, the installation height of a lid 7 disposed over the memory chip 3 is lowered, with the result that there may occur a defect in that the lid 7 gets into touch with one or more of chip parts 9 mounted on a wiring substrate 1.

In order to address the above problem, a BGA 14 of the first modification shown in FIG. 10 is configured in such a way that through-silicon vias 3e are formed on the thin memory chip 3, and another thin memory chip 15 is built up over the memory chip 3 with the through-silicon vias 3e therebetween.

Thanks to the above configuration of the memory chips 3 and 15, the lid 7 can be disposed at a higher position.

In other words, the BGA 14 has a structure in which the thin memory chip 15 is built up over the memory chip 3 on which the plural through-silicon vias 3e is formed, which enables the lid 7 to be disposed at the higher position than a position at which the lid 7 of the BGA 20 shown in FIG. 11 is disposed. Therefore it becomes possible to prevent the lid 7 from getting into touch with one or more of the chip parts 9, and the generation of noises can be hampered.

Here, the upper memory chip 15 is physically joined to the lower memory chip 3 via a resin adhesive agent 17, and is electrically joined to the lower memory chip 3 via the through-silicon vias 3e and bumps 18.

As is the case with the BGA 5 according to the above-described embodiment, the BGA 14 according to the first modification has also an advantage in that its mounting area can be reduced.

A dummy chip, a spacer, or the like can be built up over the memory chip 3 instead of the memory chip 15.

Next, a second modification shown in FIG. 12 has a structure that is formed so that the height of a lid 7 is high.

In other words, setting the heights of chip parts 9, which are chip capacitors, large (high) is an effective way to enhance a noise removal effect as a means to reduce noises generated from a semiconductor chip in which digital circuits are embedded.

Further, although a BGA 21 according to the second comparative example shown in FIG. 13 has a structure in which, the capacities of chip parts 9, which are chip capacitors, are made large by setting the sizes (heights) of the chip parts 9 large (high) in order to enhance a noise removal effect, there may occur a defect in that a lid 7 disposed on a memory chip 3 gets into touch with one or more of the chip parts 9 mounted on a wiring substrate 1 because of the heights of the chip parts 9 being made high.

Therefore, a BGA 16 of the second modification shown in FIG. 12 is configured in such a way that through-silicon vias 3e are formed on a memory chip 3, another thin memory chip 15 is built up over the memory chip 3, the lid 7 is disposed at a higher position, and additionally, the height of the lid 7 is made higher.

In other words, the BGA 16 has a structure in which another thin memory chip 15 is built up over the memory chip 3 on which the through-silicon vias 3e are formed, which enables the lid 7 to be disposed at the higher position than a position at which the lid 7 of the BGA 21 shown in FIG. 13 is disposed. Additionally, the height of the lid 7 is made higher, therefore it becomes possible to prevent the lid 7 from getting into touch with one or more of the chip parts 9, and a noise removal effect can be enhanced.

Here, as is the case with the first modification, the upper memory chip 15 is physically joined to the lower memory chip 3 via a resin adhesive agent 17, and is electrically joined to the lower memory chip 3 via the through-silicon vias 3e and bumps 18.

Further, as is the case with the BGA 5 according to the above-described embodiment, the BGA 16 according to the second modification has also an advantage in that its mounting area can be reduced.

Further, a dummy chip, a spacer, or the like can be built up over the memory chip 3 instead of the memory chip 15.

Although the present invention made by the inventors has been described on the basis of the embodiments of the present invention, it goes without saying that the present invention is not limited to the above embodiments of the present invention, and various modifications may be made without departing from the spirit and scope of the present invention.

For example, in the above embodiment, although the description has been made under the assumption that the resin diffusion prevention sections that prevent the underfills (resin agents) 6 from diffusing are the grooves 1j and 1k, the above resin diffusion prevention sections are not limited to the grooves 1j and 1k, and convex dams that are formed of solder resist films or the like can be used instead of the grooves 1j and 1k.

However, if a method in which the underfills 6 are dropped with the use of a nozzle after the chips are mounted is adopted, because there is a possibility that the convex dams hampers the movement of the nozzle, it is preferable that the grooves that are formed by concave portions on the wiring substrate 1 are used as the resin diffusion prevention sections.

Further, in the above-described embodiment, although the description has been made under the assumption that the shape of the upper surface 1a of the wiring substrate 1 is quadrate, it is not always necessary for the shape of the upper surface 1a of the wiring substrate 1 to be quadrate. In other words, it is all right if the shape of the upper surface 1a (the shape of the planar view of the wiring substrate 1) is a near-quadrate rectangular.

In the case where the shape of the upper surface 1a of the wiring substrate 1 is a near-quadrate rectangular, by arranging the control chip 2 and the memory chip 3 so that the long sides 2aa and 2ab of the control chip 2 and the long sides 3aa and 3ab of the memory chip 3 become parallel with the long sides of this upper surface 1a, the mounting area of the semiconductor device can be reduced.

However, in a semiconductor device having a structure in which two rectangular semiconductor chips and plural chip parts 9 are mounted on a wiring substrate (the two semiconductor chips are flatly disposed), and a lid 7 is installed, it is desirable to make the shape of an upper surface 1a of the wiring substrate 1 quadrate in order to minimize the mounting area of the semiconductor device.

Further, in the above-described embodiment, although the description has been made assuming that the semiconductor device is a semiconductor housed, for example, in a BGA package, it is conceivable that the semiconductor device is housed, for example, in an LGA (land grid array) package having plural rounds 1d that is mounted on the lower surface 1b of the wiring substrate 1 and to the surface of each of which an electrically conductive member is fixed. In the case where the semiconductor device is housed in the LGA, it is not necessary for chip parts 9 to be mounted on the lower surface 1b of the wiring substrate 1.

What is claimed is:

1. A semiconductor device comprising:
a first semiconductor chip including a first main surface and a first rear surface opposite to the first main surface, the first main surface being formed in a rectangular shape;
a second semiconductor chip including a second main surface and a second rear surface opposite to the second main surface, the second main surface being formed in a rectangular shape;
a wiring substrate including a first surface and a second surface opposite to the first surface, the first and second semiconductor chips being respectively flip-chip mounted on the first surface via a plurality of protruding electrodes, the first surface being formed in a quadrangular shape having a pair of first sides which are arranged opposite to each other and a pair of second sides which are arranged opposite to each other;
a cover member being disposed on the first surface of the wiring substrate and covering the first and second semiconductor chips, the cover member being secured along the second sides of the first surface of the wiring substrate,
wherein the first main surface of the first semiconductor chip and the second main surface of the second semiconductor chip are respectively arranged opposite to the first surface of the wiring substrate,
wherein long sides of the first main surface of the first semiconductor chip and the long sides of the second main surface of the second semiconductor chip are arranged substantially parallel with the first sides of the first surface of the wiring substrate,
wherein the cover member includes a pair of first brims respectively arranged along the first sides of the first surface of the wiring substrate and a pair of second brims respectively arranged along the second sides of the first surface of the wiring substrate, and
wherein the widths of the second brims are wider than the widths of the first brims, and wherein a marking is placed in one of four corner portions which is not covered with the cover member on the first surface of the wiring substrate.

2. The semiconductor device according to claim 1,
wherein the cover member is joined to the wiring substrate via a joint base area along each of the second sides of the first surface of the wiring substrate, and
wherein the widths of the second brims formed along the joint base areas are wider than the widths of the first brims.

3. The semiconductor device according to claim 2, wherein the first surface of the wiring substrate is quadrate, and
wherein a plurality of chip parts are mounted outside the respective short sides of the first semiconductor chip and the second semiconductor chip mounted on the first surface of the wiring substrate.

4. The semiconductor device according to claim 3, wherein the second brims of the cover member and the first surface of the wiring substrate are joined to each other via adhesive agents.

5. The semiconductor device according to claim 4, wherein the first brims of the cover member and the first surface of the wiring substrate are disposed with spaces therebetween.

6. The semiconductor device according to claim 1, wherein a space between the first semiconductor chip and the wiring substrate and a space between the second semiconductor chip and the wiring substrate are respectively filled with resin,
wherein the cover member is joined to the wiring substrate via a joint base area only along each of the second sides of the first surface of the wiring substrate,
wherein the widths of the second brims formed along the joint base areas are wider than the widths of the first brims that are away from the joint base area, and
wherein mounting areas for chip parts and the joint base areas for the cover member are secured on edges along the second sides of the first surface of the wiring substrate.

7. The semiconductor device according to claim 6, wherein a resin diffusion prevention section is formed on an area between the first semiconductor chip and the second semiconductor chip mounted on the first surface of the wiring substrate.

8. The semiconductor device according to claim 7, wherein the resin diffusion prevention sections are formed on areas between either of the first semiconductor chip and the second semiconductor chip mounted on the first surface of the wiring substrate and the chip parts.

9. The semiconductor device according to claim 8, wherein the resin diffusion prevention sections are grooves.

10. The semiconductor device according to claim 1, wherein the first rear surface of the first semiconductor chip and the second rear surface of the second semiconductor chip are respectively joined to the cover member via heat conductive adhesive agents or solder agents, and
wherein short sides of the first main surface of the first semiconductor chip and the short sides of the second main surface of the second semiconductor chip are arranged substantially parallel with the second sides of the first surface of the wiring substrate.

11. The semiconductor device according to claim 1, wherein the cover member is comprised of a metal plate.

12. The semiconductor device according to claim 1, wherein a plurality of external connection terminals and a plurality of chip parts are mounted on the second surface of the wiring substrate.

13. The semiconductor device according to claim 12, wherein the respective heights of the external connection terminals from the second surface of the wiring substrate are higher than the heights of the chip parts mounted on the second surface from the second surface.

14. The semiconductor device according to claim 1, wherein the first semiconductor chip is a control chip, the second semiconductor chip is a memory chip, and the memory chip is controlled by the control chip.

15. The semiconductor device according to claim 3, wherein the respective chip parts are chip capacitors, and the external connection terminals mounted on the second surface of the wiring substrate are ball electrodes.

16. The semiconductor device according to claim 1, wherein the first surface of the wiring substrate is a rectangle.

17. The semiconductor device according to claim 1, wherein the cover member being transparent.

18. The semiconductor device according to claim 1, wherein the cover member includes the pair of first brims respectively arranged parallel along the first sides of the first surface of the wiring substrate and a pair of second brims respectively arranged parallel along the second sides of the first surface of the wiring substrate.

19. The semiconductor device according to claim 1, wherein long sides of the first and second semiconductor chips are arranged in a same direction and short sides of the first and second semiconductor chips are arranged in a same direction.

20. The semiconductor device according to claim 1, further comprising chip parts adjacent to the first and second semiconductor chips.

21. The semiconductor device according to claim 1, further comprising a plurality of chip parts being mounted outside short sides of the first semiconductor chip on the first surface of the wiring substrate and outside short sides of the second semiconductor chip on the first surface of the wiring substrate.

* * * * *